United States Patent [19]

Rijnbeek et al.

[11] Patent Number: 5,758,398

[45] Date of Patent: Jun. 2, 1998

[54] METHOD OF MANUFACTURING MULTILAYER ELECTRONIC COMPONENTS

[75] Inventors: Antonius G. Rijnbeek, Maarheeze; Jacques Warnier, Eijsden, both of Netherlands

[73] Assignee: U.S. Philips Corporation, New York, N.Y.

[21] Appl. No.: 673,833

[22] Filed: Jun. 27, 1996

[30] Foreign Application Priority Data

Jun. 27, 1995 [EP]  European Pat. Off. ............ 95201740

[51] Int. Cl.$^6$ ........................................................ H01G 4/30
[52] U.S. Cl. ........................... 29/25.42; 29/854; 361/306.3
[58] Field of Search .............................. 29/25.42, 25.41, 29/854; 361/306.3

[56] References Cited

U.S. PATENT DOCUMENTS

| | | | |
|---|---|---|---|
| 4,776,904 | 10/1988 | Charlton et al. | 156/73.1 |
| 4,841,411 | 6/1989 | Kessler | 29/25.42 X |
| 5,239,736 | 8/1993 | Sliwa, Jr. et al. | 29/25.35 |
| 5,252,883 | 10/1993 | Kondo | 310/328 |
| 5,295,289 | 3/1994 | Inagaki et al. | 29/25.42 |
| 5,603,147 | 2/1997 | Bischoff et al. | 29/25.42 |

FOREIGN PATENT DOCUMENTS

| | | |
|---|---|---|
| 2152281 | 7/1985 | United Kingdom . |
| 2191434 | 12/1987 | United Kingdom . |

OTHER PUBLICATIONS

"Capacitors" by Donald M. Trotter, Jr., Scientific American, Jul. 1988 pp. 58–63.

*Primary Examiner*—James F. Coan
*Attorney, Agent, or Firm*—Norman N. Spain

[57] ABSTRACT

A method of manufacturing a plurality of multilayer electronic components, comprises the steps of:

(a) Manufacturing a laminated sheet (1) in which layers of ceramic tape are each provided on one side with a pattern of electrodes; are stacked so that the electrode patterns on consecutive layers are offset back and forth with respect to one another, and are pressed together, cutting the laminated sheet into segments in which consecutive electrodes with a gas cooled laser beam, are alternately exposed at a different segment edge with a gas cooled laser beam; sintering the segments and providing electrical contacts which interconnect the electrodes exposed at given segment edges.

7 Claims, 3 Drawing Sheets

METHOD OF MANUFACTURING MULTILAYER ELECTRONIC COMPONENTS

The invention relates to a method of manufacturing a plurality of multilayer electronic components, comprising the steps of:

(a) Manufacturing a laminated sheet in which layers of ceramic tape are each provided on one side with a pattern of electrodes, are stacked so that the electrode patterns on consecutive layers are offset back and forth with respect to one another, and are pressed together;

(b) Cutting the laminated sheet into segments in which consecutive electrodes are alternately exposed at a different segment edge;

(c) Sintering the segments;

(d) Providing electrical contacts which interconnect the electrodes exposed at given segment edges.

The invention also relates to electronic components manufactured using this method. Such components may receive application as, for example, multilayer capacitors or actuators.

The term "ceramic tape" (also called "green-ceramic tape") refers to an unsintered mixture of dielectric (ceramic) particles and at least one binding agent (binder), which are cast into a thin sheet and dried so as to form a limp "foil". When such a foil is sintered, the binder contained therein is "burned out".

A method as stated in the opening paragraph is known from an article by D. M. Trotter, Jr., in *Scientific American*, Jul. 1988, pp 58–63 (in particular page 61), and from U.S. Pat. No. 5,252,883. Commonly employed methods for performing the cutting step (b) include scoring and breaking, chopping with a blade (dicing), or cutting with a saw (as in U.S. Pat. No. 5,252,883), all of which have certain disadvantages, particularly with regard to the quality of the resulting cut. For example:

(1) Breaking the laminated sheet along a score line produces a relatively rough edge. In addition, since breaking in this manner entails a characteristic hinging of the laminated sheet about the score line, there is a possibility of damage due to lateral stretching of the laminated layers. Moreover, this method can only be used to sever the laminated sheet along a straight line: cutting along a curved path is not possible;

(2) Chopping with a blade can cause crushing of the relatively soft laminated sheet perpendicular to its plane;

(3) In the case of sawing, the characteristic back-and-forth blade motion can cause tearing along the edge of the laminated sheet. Moreover, intrinsic wear of the employed cutting tool (blade or saw) in cases (2) and (3) causes progressive deterioration of the quality of the cut, and entails extra expense by necessitating the periodic replacement of worn blades.

It is an object of the invention to provide a method of cutting a laminated sheet such as that produced in step (a) hereabove, without causing significant mechanical deformation of the sheet. In addition, it is an object of the invention that such a method should not entail significant mechanical wear of employed cutting tools. Moreover, it is an object of the invention that such a method should allow cutting to be performed along a curved path.

These and other objects are achieved in a method as specified in the opening paragraph, characterised in that the cutting step (b) is performed by directing a focused laser beam onto the plane of the laminated sheet and by effecting relative motion of the beam with respect to the sheet so as to trace the beam along a selected cutting path, whereby the intercept of the beam and the sheet is cooled by a flow of non-flammable gas.

The term "non-flammable gas" is here intended to refer to any gas which does not spontaneously ignite in air when subjected to the highest temperature prevailing at the intercept of the laser beam and the laminated sheet. Such a gas may be pure, or it may in fact be a mixture of different gases, or it may comprise a vapour. Since it fulfils a cooling function, it preferably has a large heat capacity, though this is not a strict requirement. The administered gas may at ambient temperature, or it may be warmer or cooler than its surroundings, as desired. Examples of suitable gases in the context of the invention include air, the inert gases, $N_2$ and $CO_2$, among many others.

In the inventive method, heat generated by absorption of laser radiation in the laminated sheet causes evaporation of the binding agent (e.g. polyvinyl alcohol or latex) employed in both the ceramic tape and the electrodes deposited thereon. In tests leading to the invention, it was observed that such evaporation is generally accompanied by burning of the sheet edge to some extent, which is highly undesirable. However, by providing a flow of coolant gas at the cutting point, the inventors have managed to achieve an excellent quality cut without attendant burning of the laminated sheet.

An immediate advantage of the inventive method is that it does not rely on mechanical contact between the laminated sheet and a cutting tool, so that there is no stretching, crushing or tearing of the sheet edge, and no attendant tool wear.

A particularly satisfactory embodiment of the inventive method is characterised in that the employed laser is a carbon dioxide ($CO_2$) laser. Other lasers which are suitable for application in the inventive method include, for example, YAG and excimer lasers. The choice of laser will depend inter alia on the thickness of the laminated sheet and on its particular material constitution, since such parameters will place a lower limit on the required radiative fluence for the cutting procedure. For the laminated sheet compositions common to commercially available multilayer capacitors and actuators (thickness of the order of 0.5–2.5 mm), the inventors have obtained high-quality cutting performance from a focused $CO_2$ laser having a wavelength of 10 μm and a radiative power in the range 300–1000 W. The employed laser may be pulsed or continuous.

A preferential embodiment of the method according to the invention is characterised in that the thickness of the laminated sheet lies in the range 0.1–3.0 mm, and that the fluence of the laser beam at its focus lies in the range 50–500 $kW/mm^2$. Within these ranges, a lateral cutting speed of the order of 200 mm/s can easily be obtained.

Apart from the influence of parameters such as its heat capacity and temperature, the practical cooling effect of the coolant gas will also be determined by its flow rate and flow density. In this respect, the inventors have achieved good results using flow-rates in the range 0.1–1.0 liters per second (measured at a temperature of 25° C. and a pressure of 1 atmosphere), the flow being directed along the laser beam through a nozzle exit having a diameter of the order of 0.6 mm and located within a few millimeters of the laminated sheet.

In a preferred embodiment of the inventive method, the flow of coolant gas is provided by a nozzle comprising:

a hollow chamber;

a gas exit aperture in a wall of the chamber;

a focusing lens which forms part of a wall of the chamber and whose optical axis passes through the gas exit aperture, and a gas inlet aperture, to supply the hollow chamber with gas, whereby, during cutting, the laser beam is directed along the optical axis of the focusing lens. Such a nozzle serves both to focus the laser beam and to direct the flow of coolant gas. In a preferential embodiment of the nozzle, the chamber is tapered towards the gas exit aperture, so as to provide a focused jet of coolant gas coincident with the emergent laser beam. See FIG. 6.

The choice of dielectric material in the ceramic tape will determine the suitability of the electronic component for various applications. If the component is to be used as a multilayer actuator, then the dielectric material should comprise a piezoelectric material such as $BaTiO_3$ or $PbTiO_3$ (having a perovskite structure), for example. On the other hand, if the component is intended for use as a multilayer capacitor, then the dielectric material may comprise Ce-doped $BaTiO_3$, for example. The electrode pattern may be provided using, for example, silver-palladium ink or Pd-PdO ink in combination with a screen printing procedure. To date, the inventive method has successfully been employed on various laminated sheets comprising a wide range of dielectric materials and binders.

It should be explicitly noted that the layers of ceramic tape which constitute the laminated sheet need not all be of the same thickness, or of the same material constitution. The same applies to the electrode patterns. In addition, it is not necessary that the thickness of the laminated sheet be completely uniform.

The invention and its attendant advantages will be further elucidated with the aid of exemplary embodiments and the accompanying schematic drawings, not all of uniform scale, whereby:

FIG. 1 renders a perspective view of part of a laminated sheet which is being cut using a method according to the invention;

FIG. 2 gives a plan view of layers of ceramic tape which have been provided with a particular electrode pattern;

EMBODIMENT 1

Figure 1:
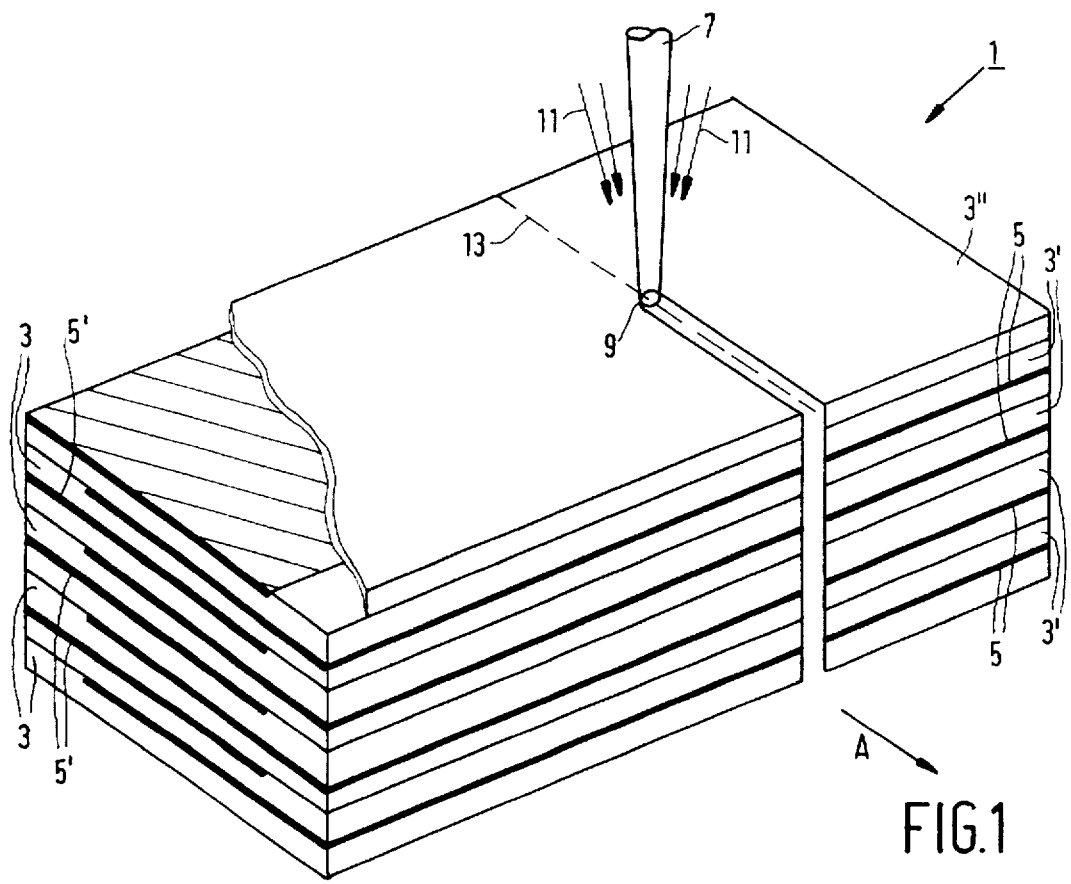

FIG. 1 shows part of a laminated sheet 1 which is being cut using a method in accordance with the present invention. The depicted schematic view is partly perspective and partly cross-sectional, and is not to scale. The sheet 1 comprises rectangular layers 3, 3' of so-called green (i.e. unsintered) ceramic tape, which have been pressed into a stacked arrangement. Each layer 3 is provided on one face with an electrode pattern 5, which in this case takes the form of a rectangle extending as far as a given edge of the layer 3 but stopping short of the opposite edge. Each layer 3' is similarly provided with an electrode pattern 5'. The layers 3 and 3' are stacked in alternate arrangement in such a way that, along a given edge of the sheet 1, only the electrodes 5 are exposed, whereas, along the opposite edge of the sheet 1, only the electrodes 5' are exposed (in FIG. 1, these are respectively the front and rear long edges).

The layers 3, 3' may be manufactured from a so-called viscous slip comprising a suspension of particles of dielectric material (e.g. doped or undoped $BaTiO_3$) in a liquid organic binder (such as a polyvinyl alcohol, e.g. Hoechst PVA 20–98 or PVA 56–98). This slurry can be poured onto a paper sheet where, upon drying, it forms a flat layer of dry ceramic tape (typical thickness of the order of 10 μm), which can later be removed from the paper sheet. This ceramic tape can be cut into portions of equal form and size (e.g. identical rectangles measuring 100×100 $mm^2$), and all these portions can be provided on one face with the desired electrode pattern, by screen-printing them in silver-palladium ink, for example (the thickness of the ink-layer being of the order of 0.5–2 μm). The portions thus obtained can then be stacked on one another so that all electrode patterns are "face up", but so that alternate sheets are rotated through an in-plane angle of 180° with respect to one another; in this manner, it is possible to achieve a back-and-forth offset of alternate electrode patterns. If so desired, this stack can be finished off with an additional layer of "plain" ceramic tape (i.e. without an electrode pattern), as in the case of layer 3" in FIG. 1. Finally, the stack can be compressed into a compact laminated sheet (using a pressure typically of the order of 3000 bar). Generally, such a laminated sheet 1 will have a thickness of the order of 0.5–2.5 mm, wherein the individual layers 3, 3' each have a thickness of the order of 4–20 μm.

As depicted in FIG. 1, the laminated sheet 1 is being cut in accordance with the invention using a focused laser beam 7 (not to scale). This beam 7 is derived from a continuous $CO_2$ laser, and is focused into a spot 9 having a diameter of approximately 50 μm. The laser has a wavelength of 10 μm and a radiative power of 200 W, so that the fluence in the spot 9 is approximately 100 $kW/mm^2$. The arrows 11 schematically represent a flow of coolant gas which is directed (from an undepicted nozzle) towards the spot 9 along the direction of the laser beam 7. The employed gas is air at a temperature of 25° C. (room temperature) and a flow rate of 0.5 liters per second.

The effect of the beam 7 is to locally raise the temperature of the sheet 1 to (or beyond) a point at which the organic binder in the layers 3, 3' and the electrodes 5, 5' evaporates, while the flow 11 of gas simultaneously prevents unwanted burning of the sheet 1. By tracing the spot along a (predetermined) cutting path 13, e.g. by translating the sheet 1 relative to the beam 7 in the direction A, it is possible to neatly cut the sheet 1 along a straight or curved line. By repeating such cuts, the sheet 1 can be subdivided into small segments (having typical lateral dimensions of the order of 1×0.5–4×5 $mm^2$), which can be used to make electronic components.

EMBODIMENT 2

Figure 2:
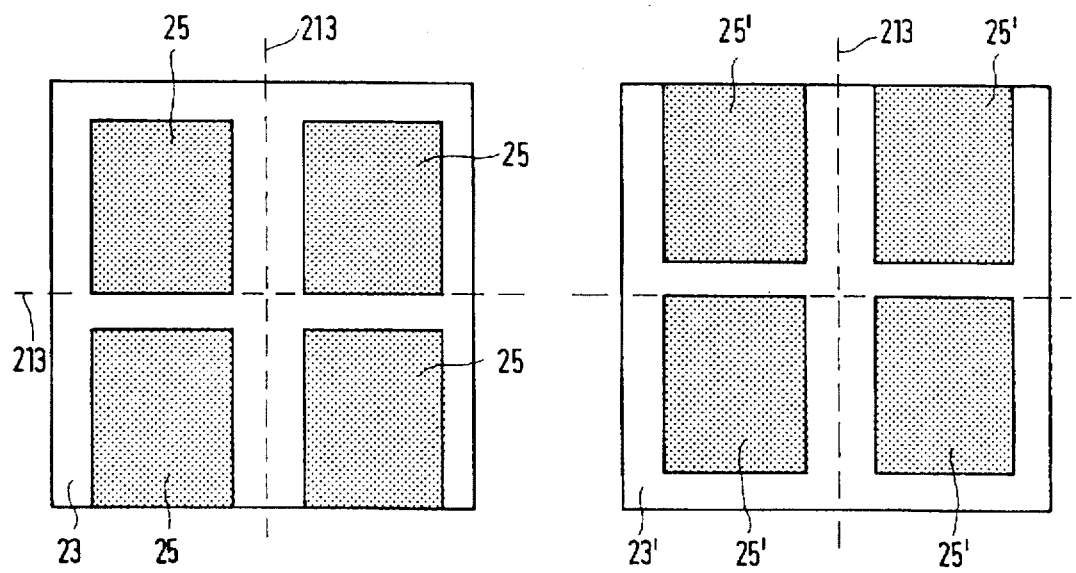

FIG. 2 renders a plan view of two layers 23, 23' of ceramic tape. These layers have respectively been provided with electrode patterns 25, 25'. As here depicted, layer 23' is identical to layer 23, and has merely been rotated through an in-plane angle of 180° with respect to the latter.

A laminated sheet can be manufactured by alternately stacking a plurality of layers 23 and 23' face-up in a direction perpendicular to their planes, so that their edges are flush (just as in FIG. 1). This stack can then be finished off with a layer of plain ceramic tape (i.e. without electrode pattern), and pressed. If the stack thus obtained is cut along the lines 213, then the resulting rectanguloidal segments (each with six faces) will have four faces where only ceramic tape is visible, a first face where the electrodes 25 are exposed, and an oppositely-located second face where the electrodes 25' are exposed. The electrodes are therefore electrically insulated from the outside world, except at the first and second faces.

In practice, the layers of ceramic tape employed in electronic component manufacture will generally comprise a great plurality (many hundreds or thousands) of the "unit cells" depicted in FIG. 2.

EMBODIMENT 3

The cut segments produced by the procedure in Embodiment 2 were sintered for 2 hours at a temperature of approximately 1200° C. (step (c) of the inventive method). Such a sintered segment 31 is depicted in cross-section in FIG. 3, where it is being provided with electrical contacts (step (d) of the inventive method). The depicted view is partly elevational and partly cross-sectional.

Figure 3:
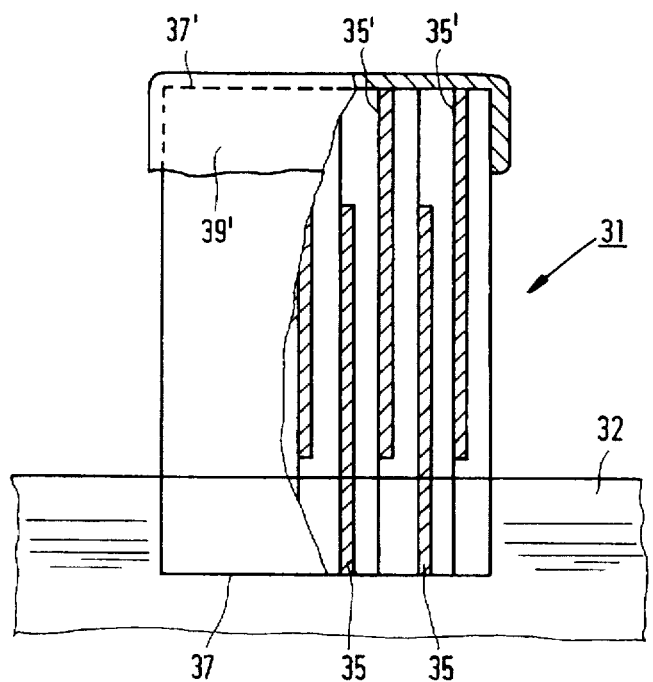
FIG. 3 shows a cut segment of a laminated sheet which is being provided with electrical contacts.

One way of providing the required electrical contacts is to dip the segment 31 into a metallisation bath 32 of, for example, silver-palladium ink. As shown in FIG. 3, all the electrodes 35 extend as far as the face 37 of the segment 31, but they stop short of the face 37'; similarly, all the electrodes 35' extend as far as the face 37', but stop short of the face 37. Once the segment 31 has been dipped in the bath 32, removed, and allowed to dry, a conductive cap of silver-palladium metal will embrace the face 37, thereby interconnecting the edges of the electrodes 35 exposed at that face. As here depicted, such a cap 39' has already been provided upon the opposite face 37'.

If so desired, the metallic caps provided in this manner can be subsequently thickened using an electroplating procedure, for example.

A possible alternative to the provision of metal caps is the electroless deposition of metal onto the faces 37, 37', using sputter deposition, for example. Once again, the metal layers thus deposited can then be thickened by means of electroplating.

EMBODIMENT 4

Figure 4:
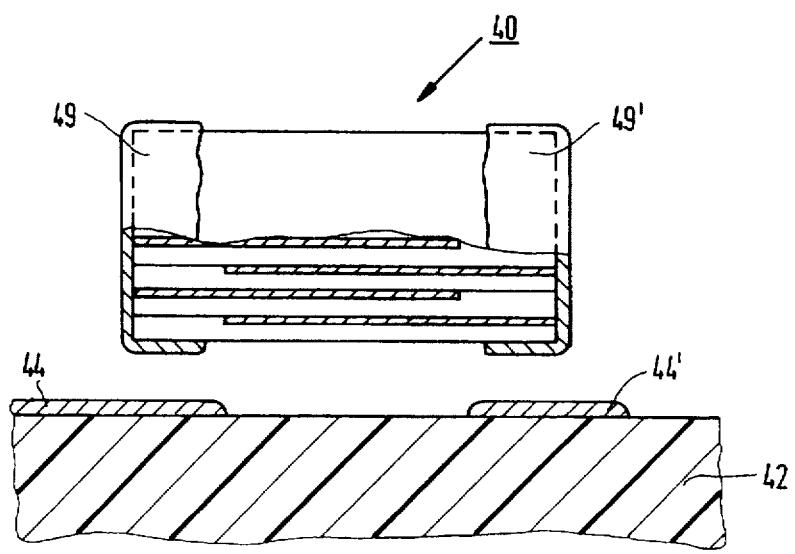
FIG. 4 depicts an electronic component in accordance with the invention, which is suitable for surface-mounting on a printed circuit board.
Figure 5:
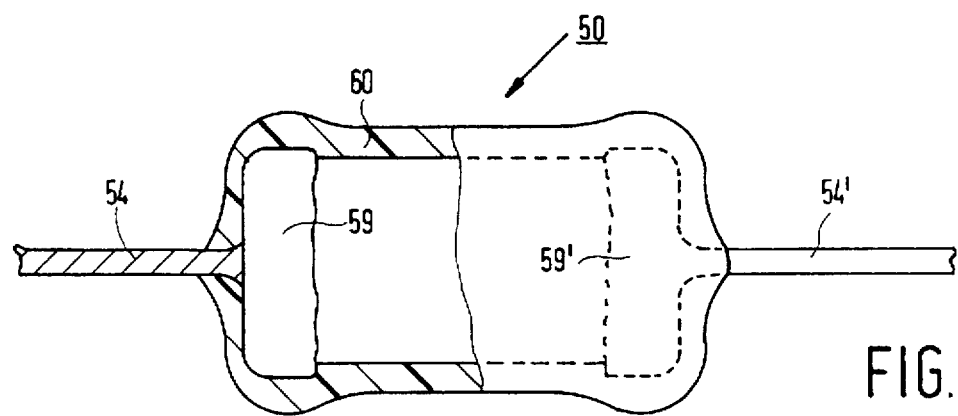
FIG. 5 shows an electronic component according to the invention, which has been provided with wire leads.

FIGS. 4 and 5 depict electronic components according to the invention. Both Figures are partly elevational and partly cross-sectional.

In FIG. 4, an electronic component 40 such as that produced in Embodiment 3 is being surface-mounted onto a printed circuit board (PCB) comprising an insulating substrate 42 on which conductive lands 44, 44' have been provided. The conductive caps 49, 49' on the component 40 can be positioned on the respective lands 44, 44' and can be fixed thereto using a layer of solder.

FIG. 5 shows an electronic component 50 with conductive caps 59, 59'. Metal wires 54, 54' have been attached to the respective caps 59, 59', using a soldering procedure, for example. The body of the component is then covered in an electrically insulating jacket 60, comprising polymeric resin, for example. Such a component 50 is suitable for hole-mounting on a PCB.

EMBODIMENT 5

Figure 6:
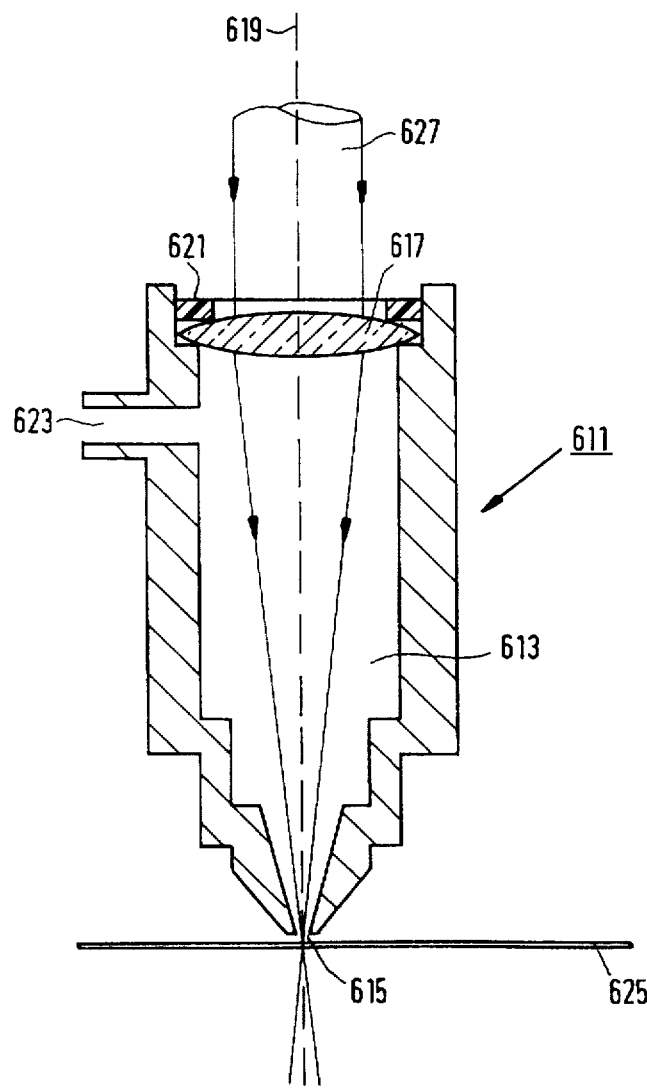
FIG. 6 depicts a gas nozzle suitable for use in the inventive method.

FIG. 6 shows a preferential embodiment of a gas nozzle 611 suitable for use in the inventive method. In the depicted cross-sectional view, the nozzle 611 comprises a tapered internal hollow chamber 613. This chamber 613 has a gas exit aperture 615 at one extremity, and is provided with a focusing lens 617 at an opposite extremity. The optical axis 619 of the lens 617 passes through the centre of the exit aperture 615. By virtue of the presence of sealing means 621 (e.g. a rubber O-ring), the lens-end of the chamber 613 is gas-tight. Also depicted is a gas inlet aperture 623.

When cutting a laminated sheet 625 in accordance with the invention, the nozzle 611 is positioned just above (i.e. within a few millimeters of) the sheet 625, so that the focus of the lens 617 lies upon or within the sheet 625. When a laser beam 627 is directed into the nozzle 611 along the axis 619, it will cut the sheet 625 at the intercept of the axis 619 and the sheet 625. At the same time, coolant gas (e.g. air) administered via the inlet aperture 623 will emerge as a focused (high-pressure) jet from the aperture 615, substantially coincident with the emergent laser beam.

We claim:

1. A method of manufacturing a plurality of multilayer electronic components, comprising the steps of:

(a) Manufacturing a laminated sheet in which layers of ceramic tape are each provided on one side with a pattern of electrodes, are stacked so that the electrode patterns on consecutive layers are offset back and forth with respect to one another, and are pressed together;

(b) Cutting the laminated sheet into segments in which consecutive electrodes are alternately exposed at a different segment edge;

(c) Sintering the segments;

(d) Providing electrical contacts which interconnect the electrodes exposed at given segment edges, characterised in that the cutting step (b) is performed by directing a focused laser beam onto the plane of the laminated sheet and by effecting relative motion of the beam with respect to the sheet so as to trace the beam along a selected cutting path, whereby the intercept of the beam and the sheet is cooled by a flow of non-flammable gas.

2. A method according to claim 1, characterised in that the employed laser is a carbon dioxide ($CO_2$) laser.

3. A method according to claim 1 or 2, characterised in that the thickness of the laminated sheet lies in the range 0.1–3.0 mm, and that the fluence of the laser beam at its focus lies in the range 50–500 kW/mm$^2$.

4. A method according to claim 1, characterised in that the non-flammable gas is air, and that its flow-rate lies in the range 0.1–1.0 liters per second (measured at a temperature of 25° C. and a pressure of 1 atmosphere).

5. A multilayer capacitor manufactured using a method as claimed in claim 1.

6. A multilayer piezoelectric actuator manufactured using a method as claimed in claim 1.

7. A method according to claim 3, characterized in that the non-flammable gas is air, and that its flow-rate lies in the range 0.1–1.0 liters per second (measured at a temperature of 25° C. and a pressure of 1 atmosphere).

* * * * *